US008053741B2

(12) United States Patent
Sekoguchi

(10) Patent No.: US 8,053,741 B2

(45) Date of Patent: Nov. 8, 2011

(54) ION-GENERATING DEVICE AND ELECTRICAL APPARATUS

(75) Inventor: Yoshinori Sekoguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 303 days.

(21) Appl. No.: 12/307,499

(22) PCT Filed: Jun. 25, 2007

(86) PCT No.: PCT/JP2007/062662

§ 371 (c)(1), (2), (4) Date: Jan. 5, 2009

(87) PCT Pub. No.: WO2008/004454

PCT Pub. Date: Jan. 10, 2008

(65) Prior Publication Data

US 2009/0283692 A1 Nov. 19, 2009

(30) Foreign Application Priority Data

Jul. 6, 2006 (JP) ................................ 2006-186925

(51) Int. Cl.
*H01L 21/00* (2006.01)
*H01L 21/02* (2006.01)
*H05F 3/04* (2006.01)

(52) U.S. Cl. ................ 250/424; 250/423 P; 250/423 F; 361/231; 361/232

(58) Field of Classification Search ................. 361/231, 361/232; 250/423 P, 423 F, 424

See application file for complete search history.

(56) References Cited

U.S. PATENT DOCUMENTS

| | | | | |
|---|---|---|---|---|
| 6,791,814 | B2 * | 9/2004 | Adachi et al. | 361/231 |
| 7,091,481 | B2 * | 8/2006 | Miller et al. | 250/288 |
| 7,120,006 | B2 * | 10/2006 | Sekoguchi et al. | 361/230 |
| 7,279,680 | B2 * | 10/2007 | Miller et al. | 250/288 |
| 7,639,472 | B2 * | 12/2009 | Sekoguchi et al. | 361/230 |
| 2004/0145853 | A1 | 7/2004 | Sekoguchi et al. | |

FOREIGN PATENT DOCUMENTS

| | | | |
|---|---|---|---|
| JP | 1-21536 | Y2 | 6/1989 |
| JP | 2001-189199 | A | 7/2001 |
| JP | 2002-374670 | A | 12/2002 |
| JP | 2003-123940 | A | 4/2003 |
| JP | 2003-168541 | A | 6/2003 |
| JP | 2004-311630 | A | 11/2004 |
| JP | 2005-142131 | A | 6/2005 |

* cited by examiner

*Primary Examiner* — David A Vanore

(74) *Attorney, Agent, or Firm* — Birch, Stewart, Kolasch & Birch, LLP

(57) ABSTRACT

An outer casing is partitioned, in a plan view, into a high-voltage transformer drive circuit block for disposing at least a high-voltage transformer drive circuit, a high-voltage transformer block for disposing at least a secondary side of a high-voltage transformer, and an ion-generating element block for disposing an ion-generating element. It is thereby possible to obtain an ion-generating device suitable for reduction in size and thickness, and an electrical apparatus mounted with the same.

14 Claims, 12 Drawing Sheets

ION-GENERATING DEVICE AND ELECTRICAL APPARATUS

TECHNICAL FIELD

The present invention relates to an ion-generating device and an electrical apparatus, and particularly relates to an ion-generating device and an electrical apparatus that include a transformer drive circuit, a transformer, and an ion-generating element.

BACKGROUND ART

Many ion-generating devices that utilize a discharge phenomenon have been put into practical use. Each of these ion-generating devices is generally configured with an ion-generating element for generating ions, a high-voltage transformer for supplying a high voltage to the ion-generating element, a high-voltage transformer drive circuit for driving the high-voltage transformer, and a power supply input portion such as a connector.

Ion-generating elements are roughly categorized into two major types. One type uses a metal wire, a metal plate having an acute-angled portion, needle-shape metal, or others as a discharge electrode, and uses a metal plate, a grid, or others at a ground potential as a counter electrode, or uses the ground as a counter electrode without specially disposing a counter electrode. In this ion-generating element, air serves as an insulator. This ion-generating element utilizes a scheme to produce a discharge phenomenon by causing electric field concentration at a tip of an electrode, identified as an acute-angled portion, when applying a high voltage to the electrode, and causing an electrical breakdown of the air in close vicinity of the tip.

The other type is configured with a pair of an induction electrode embedded in a high-breakdown voltage dielectric, and a discharge electrode disposed at a surface of the dielectric. The ion-generating element of this type utilizes a scheme to produce a discharge phenomenon by causing electric field concentration in proximity to an outer edge portion of the discharge electrode at the surface when applying a high voltage to the electrode, and causing an electrical breakdown of the air in close vicinity thereof.

As a high-voltage transformer that applies a high voltage to the above-described ion-generating element, a winding transformer having a primary winding and a secondary winding, and a piezoelectric transformer made of a piezoelectric ceramic element and utilizing a piezoelectric phenomenon, have been put into practical use.

As to the conventional ion-generating device, Japanese Patent Laying-Open No. 2002-374670, for example, describes an example. This ion-generating device is of a type in which an ion-generating electrode is set as a discharge electrode and no counter electrode is disposed. In this ion-generating device a piezoelectric transformer that supplies a high voltage to the ion-generating electrode, and a drive circuit for driving the piezoelectric transformer are mounted in a casing, and integrated by molding. It is noted that the ion-generating electrode is disposed outside the casing, and connected to a cable led out from the casing.

As to the high-voltage transformer, the above-described publication describes the differences between a piezoelectric transformer and a winding transformer, and their advantages and disadvantages, stating that although a piezoelectric transformer itself can be made more compact than a winding transformer, its peripheral circuitry becomes more complicated. This publication also describes that the high-voltage transformer and other components are mounted on the same substrate, and that the substrate is disposed in an outer casing by being lifted off from a bottom surface of the casing at a certain distance.

Patent Document 1: Japanese Patent Laying-Open No. 2002-374670

DISCLOSURE OF THE INVENTION

Problems to be Solved by the Invention

In the ion-generating device described in the publication described above, a high-voltage transformer and a drive circuit are collectively molded within the casing. Therefore, for example, it is not possible to mold only the high-voltage transformer without molding the drive circuit, and it is not possible to efficiently mold only the high-voltage portion. Further, if the high-voltage portion is not molded, discharge may possibly occur at a portion of the high-voltage portion other than the ion-generating electrode. To prevent such discharge, it is necessary to ensure a long insulation distance between components of the high-voltage portion. Generally, an insulation distance of 1 mm is said to be required, as a guideline, for a voltage of 1 kV. If the insulation distance is increased as such, the ion-generating device is increased in size, and hence there arises a problem of difficulty in achieving reduced size and thickness of the device.

Further, in the ion-generating device described in the above-described publication, the high-voltage transformer and the drive circuit are mounted on the same substrate. Therefore, a portion where the high-voltage transformer is disposed requires a height corresponding to a thickness of the substrate, and in addition to this, a height equal to or larger than a thickness of the high-voltage transformer on the front surface (surface for components) side of the substrate, and a height equal to or larger than a length of a soldered lead portion of the high-voltage transformer on the back surface (surface for soldering) side of the substrate. Consequently, a thickness of the ion-generating device is increased at the portion where the high-voltage transformer is disposed, and there arises a problem of difficulty in achieving reduced size and thickness of the device.

The present invention has been made in view of the above-described problems, and an object of the present invention is to provide an ion-generating device suitable for reduction in size and thickness, and an electrical apparatus mounted with the same.

Means for Solving the Problems

An ion-generating device according to the present invention is an ion-generating device which includes a transformer drive circuit, a transformer for boosting a voltage by being driven by the transformer drive circuit, and an ion-generating element for generating at least any of positive ions and negative ions by receiving the voltage boosted by the transformer. The ion-generating device includes: a casing partitioned, in a plan view, into a transformer drive circuit block for disposing at least the transformer drive circuit, a transformer block for disposing at least a secondary side of the transformer, and an ion-generating element block for disposing the ion-generating element.

In the ion-generating device according to the present invention, an inside of the casing is partitioned, in a plan view, into the transformer drive circuit block, the transformer block, and the ion-generating element block, and hence these blocks can separately be subjected to molding. For example, it is possible to mold the entire secondary side of the transformer in the transformer block, and mold a high-voltage circuit portion of the ion-generating element in the ion-generating element block, without molding an ion-generating portion. It is thereby possible to efficiently isolate the high-voltage portions of the ion-generating device in an insulating manner by molding, so that it becomes possible to dispose the portions closely, and achieve reduced size and thickness of the ion-generating device.

Preferably, in the above-described ion-generating device, each of the transformer block and the ion-generating element block has a configuration subjected to molding.

As described above, it is thereby possible to, for example, mold the entire secondary side of the transformer in the transformer block, and mold a high-voltage circuit portion of the ion-generating element in the ion-generating element block, without molding an ion-generating portion. It is thereby possible to efficiently isolate the high-voltage portions of the ion-generating device in an insulating manner by molding, so that it becomes possible to dispose the portions closely, and achieve reduced size and thickness of the ion-generating device.

Preferably, in the above-described ion-generating device, the transformer drive circuit block has a moldable configuration in a state where the transformer drive circuit is disposed therein.

It is thereby possible to subject as needed the transformer drive circuit block to molding, so that it becomes further possible to achieve reduced size and thickness of the ion-generating device.

Preferably, in the above-described ion-generating device, the casing has a wall for serving as a partition between the transformer drive circuit block and the transformer block, and the wall has a notch portion for allowing a connecting portion which electrically connects the transformer drive circuit and the transformer to pass therethrough.

This wall can serve as a partition between the transformer drive circuit block and the transformer block in a plan view, and the notch portion provided at the wall enables the transformer drive circuit and the transformer to be electrically connected to each other.

Preferably, in the above-described ion-generating device, the casing has a wall for serving as a partition between a primary side and the secondary side of the transformer. The transformer has a diameter-enlarged portion having a diameter larger than a diameter of another portion of the transformer, at an intermediate site between the primary side and the secondary side. The diameter-enlarged portion abuts against the wall in a state where the intermediate site of the transformer is fitted into a notch portion of the wall.

As such, the diameter-enlarged portion abuts against the wall in a state where the intermediate site of the transformer is fitted into the notch portion of the wall. Therefore, when the transformer block is subjected to molding, for example, it is possible to prevent a molding compound from flowing from the transformer block to the transformer drive circuit block.

Preferably, in the above-described ion-generating device, the ion-generating element includes an induction electrode, a plurality of discharge electrodes, and a supporting substrate. The induction electrode is made of a one-piece metal plate having a plurality of through holes, a thickness of a wall portion of each of the plurality of through holes being made larger than a plate thickness of the metal plate by bending a rim portion of each of the plurality of through holes. The plurality of discharge electrodes have needle-like tips which are located in the plurality of through holes of the induction electrode, respectively, and within a range of the thickness of the through holes, respectively. The supporting substrate supports the induction electrode and the plurality of discharge electrodes.

As such, the induction electrode is made of a one-piece metal plate, so that its thickness can be reduced. Further, the rim portion of the through hole is bent, so that it is possible to make a thickness of the wall portion of the through hole larger than a plate thickness of the metal plate, while forming the induction electrode out of a one-piece metal plate. By allowing the needle-like tip to be located within the range of the thickness of the through hole, the shortest distance between the induction electrode and the discharge electrode corresponds to a distance between the needle-like tip of the discharge electrode and the rim portion of the through hole of the induction electrode. Here, a thickness of the rim portion of the through hole is made larger than the plate thickness of the metal plate, and hence even if a position of the discharge electrode is somewhat displaced in the thickness direction of the rim portion, its needle-like tip remains within the range of the thickness of the through hole. Therefore, the shortest distance between the induction electrode and the discharge electrode is maintained to correspond to the distance between the needle-like tip of the discharge electrode and the rim portion of the through hole of the induction electrode, so that it becomes possible to reduce variations in amount of generated ions caused by variations in positional relationship.

Preferably, in the above-described ion-generating device, the casing has a main body and a lid body for covering the main body, the main body being partitioned, in a plan view, into the transformer drive circuit block, the transformer block, and the ion-generating element block. The lid body has a plurality of ion-ejecting holes provided to correspond to the plurality of through holes, respectively.

Preferably, in the above-described ion-generating device, the casing has a main body and a lid body for covering the main body, the main body being partitioned, in a plan view, into the transformer drive circuit block, the transformer block, and the ion-generating element block. A bottom portion of the main body has a plurality of ion-ejecting holes provided to correspond to the plurality of through holes, respectively.

Preferably, in the above-described ion-generating device, each of the plurality of ion-ejecting holes has an opening dimension smaller than an opening dimension of each of the through holes.

It is thereby possible to prevent direct hand contact with the induction electrode serving as an energized portion, and prevent an electric shock.

Another ion-generating device according to the present invention is an ion-generating device which includes a transformer drive circuit, a transformer for boosting a voltage by being driven by the transformer drive circuit, and an ion-generating element for generating at least any of positive ions and negative ions by receiving the voltage boosted by the transformer. The ion-generating device includes: a substrate; and a casing. The substrate has the transformer drive circuit mounted on a surface. The casing accommodates the substrate having the transformer drive circuit mounted thereon, the transformer, and the ion-generating element. The transformer is accommodated in the casing without being mounted on the surface of the substrate.

In another ion-generating device according to the present invention, the transformer is accommodated in the casing without being mounted on the surface of the substrate. Therefore, as to a height of the casing in the transformer block, it is possible to eliminate the thickness of the substrate, and the height required for connecting to the substrate. It is thereby possible to reduce the height of the casing in the transformer block, and reduce the size of the ion-generating device.

An electrical apparatus according to the present invention includes: the ion-generating device described in any of the foregoing; and an air blow portion for delivering at least any of positive ions and negative ions generated at the ion-generating device on an air stream of blown air.

In the electrical apparatus according to the present invention, ions generated at the ion-generating device can be delivered by the air blow portion on an air stream, so that it is possible to, for example, eject ions to an outside of an air-conditioning apparatus, and eject ions to an inside and an outside of an cooling apparatus.

EFFECTS OF THE INVENTION

As described above, according to the present invention, the casing is partitioned into element blocks in a plan view, and the transformer is accommodated in the casing without being mounted on the substrate, so that the ion-generating device can be made smaller and thinner. Therefore, it becomes possible to mount the ion-generating device on an electrical apparatus on which an ion-generating device could not previously be mounted owing to size constraints, find a wider range of uses in an electrical apparatus mounted with the ion-generating device, and achieve a higher degree of flexibility in a site where the ion-generating device is to be mounted.

DESCRIPTION OF THE REFERENCE SIGNS

1: induction electrode, 1*a*: top plate portion, 1*b*: through hole, 1*c*: bent portion, 1*d*: substrate-inserted portion, 1*e*: substrate-supporting portion, 2: discharge electrode, 3: supporting substrate, 3*a*, 3*b*: through hole, 4: solder, 5: high-voltage circuit, 10: ion-generating element, 20: high-voltage transformer, 21: primary winding, 22: secondary winding, 23, 24: terminal, 25: casing, 26: molding material, 27: lead wire, 28: diameter-enlarged portion, 30: high-voltage transformer drive circuit, 30*a*: element, 30*b*: power supply input connector, 31: substrate, 31*a*: through hole, 32: lead wire, 40: outer casing, 40*a*: main body, 40*b*: lid body, 40A: ion-generating element block, 40B: high-voltage transformer block, 40C: high-voltage transformer drive circuit block, 41, 42, 43: wall, 41*a*, 41*b*: notch portion, 44: ion-ejecting hole, 50: ion-generating device, 60: air-cleaning unit, 61: front panel, 62: main body, 63: outlet, 64: air intake port, 65: fan casing.

BEST MODES FOR CARRYING OUT THE INVENTION

An embodiment of the present invention will hereinafter be described based on the drawings.

Figure 1:
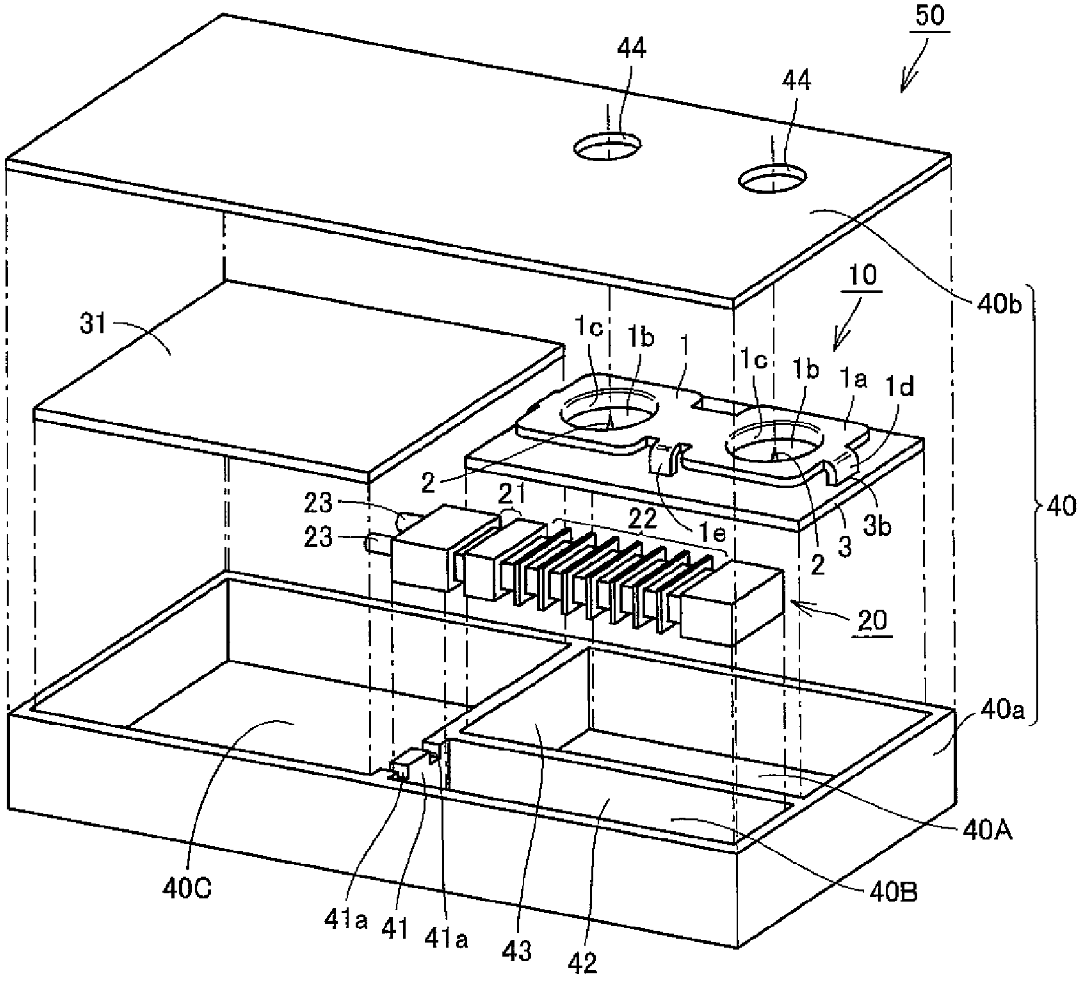
FIG. 1 is an exploded perspective view that schematically shows a configuration of an ion-generating device in one embodiment of the present invention.
Figure 2:
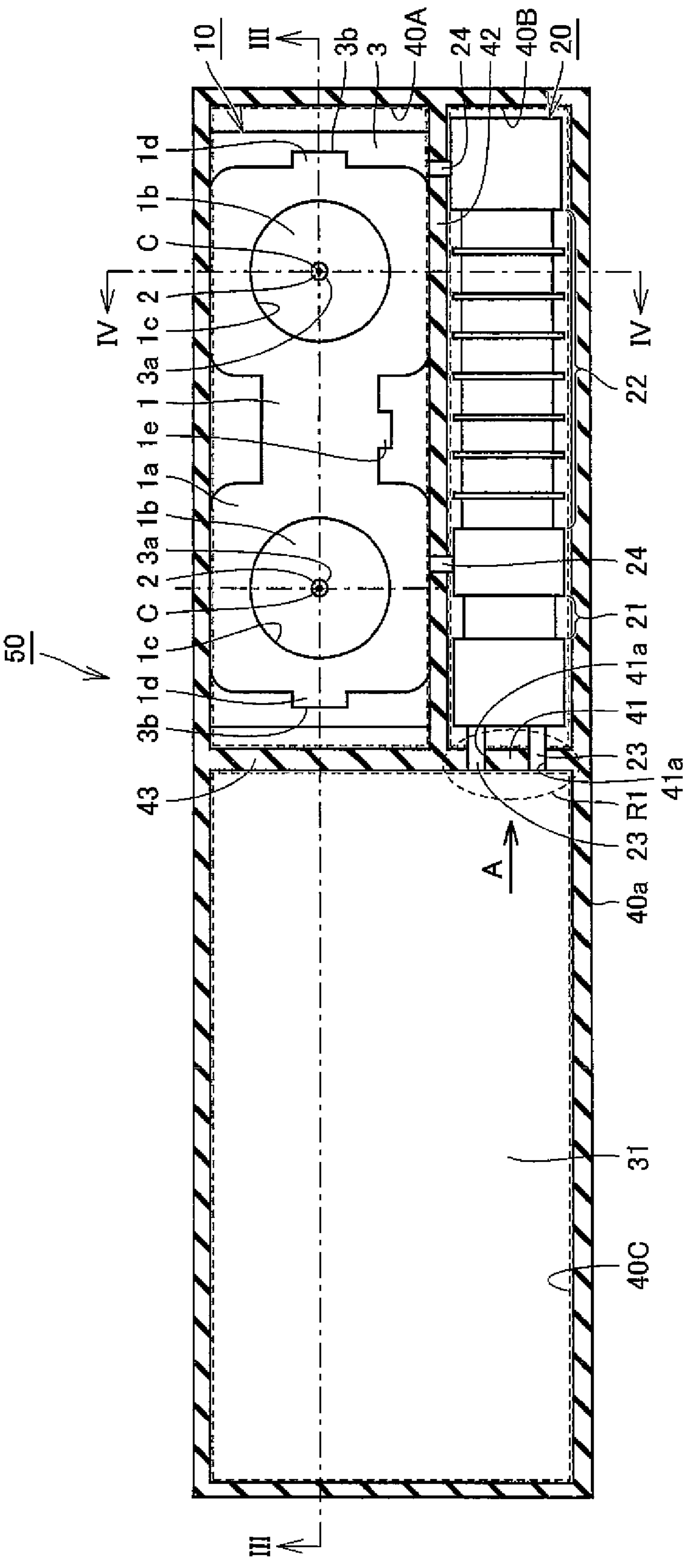
FIG. 2 is a schematic plan view of the ion-generating device shown in FIG. 1 with a lid body removed.
Figure 3:
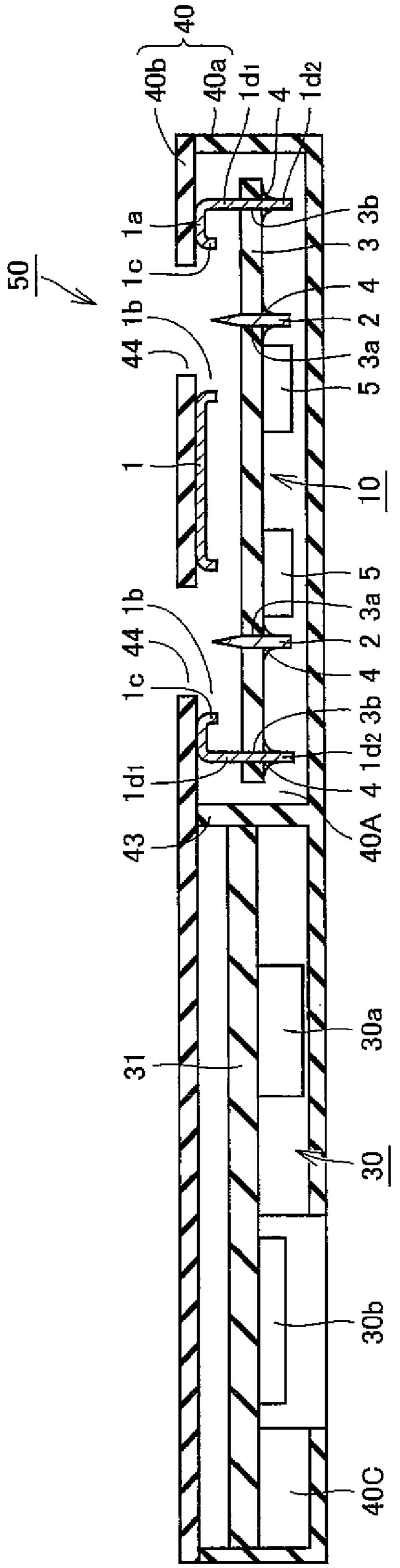
FIG. 3 is a schematic cross-sectional view taken along a line III-III in FIG. 2.
Figure 4:
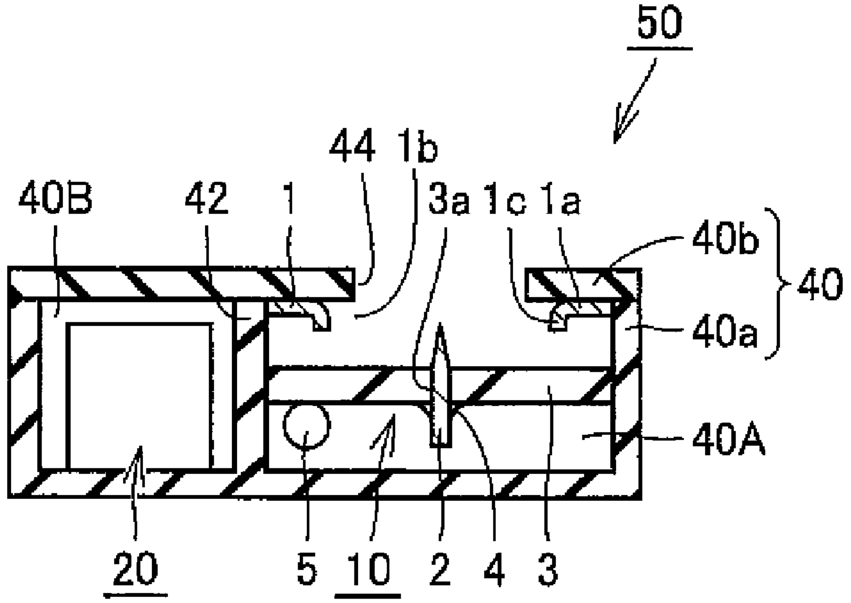
FIG. 4 is a schematic cross-sectional view taken along a line IV-IV in FIG. 2.

FIG. 1 is an exploded perspective view that schematically shows a configuration of an ion-generating device in one embodiment of the present invention. FIG. 2 is a schematic plan view of the ion-generating device shown in FIG. 1 with a lid body removed. FIG. 3 and FIG. 4 are schematic cross-sectional views taken along a line III-III and a line IV-IV in FIG. 2, respectively.

With reference to FIGS. 1-4, an ion-generating device 50 in the present embodiment has a high-voltage circuit 5 (FIG. 3), an ion-generating element 10, a high-voltage transformer 20, a high-voltage transformer drive circuit 30 (FIG. 3), a power supply input connector 30*b* (FIG. 3), and an outer casing 40.

High-voltage transformer drive circuit 30 is for receiving an input voltage from an outside to drive high-voltage transformer 20. High-voltage transformer 20 is for being driven by high-voltage transformer drive circuit 30 to boost an input voltage. Ion-generating element 10 is for generating at least any of positive ions and negative ions by receiving the voltage boosted by high-voltage transformer 20.

Outer casing 40 has a main body 40*a* and a lid body 40*b*. An inside of main body 40*a* is partitioned, in a plan view, into an ion-generating element block 40A for disposing ion-generating element 10, a high-voltage transformer block 40B for disposing high-voltage transformer 20, and a high-voltage transformer drive circuit block 40C for disposing high-voltage transformer drive circuit 30. Walls 41, 42, 43 disposed in main body 40*a*, for example, serve as partitions among blocks 40A, 40B, 40C.

Ion-generating element 10 is accommodated in ion-generating element block 40A in a state where a constituent element of high-voltage circuit 5 is attached thereto. High-voltage transformer 20 is accommodated in high-voltage transformer block 40B without being mounted on a substrate. High-voltage transformer drive circuit 30 and power supply input connector 30*b* are accommodated in high-voltage transformer drive circuit block 40C while being mounted on a substrate 31. Power supply input connector 30*b* has a part exposed to the outside of outer casing 40, and has a structure that enables power supply to be connected from the outside to itself via a connector.

Functional elements accommodated in main body 40*a* are electrically connected and molded as appropriate, as described below. Lastly, lid body 40*b* is attached to close an upper opening of main body 40*a*. It is noted that lid body 40*b* is provided with an ion-ejecting hole 44.

Next, the functional elements described above will be specifically described in the order of ion-generating element 10, high-voltage transformer 20, and high-voltage transformer drive circuit 30.

Figure 6:
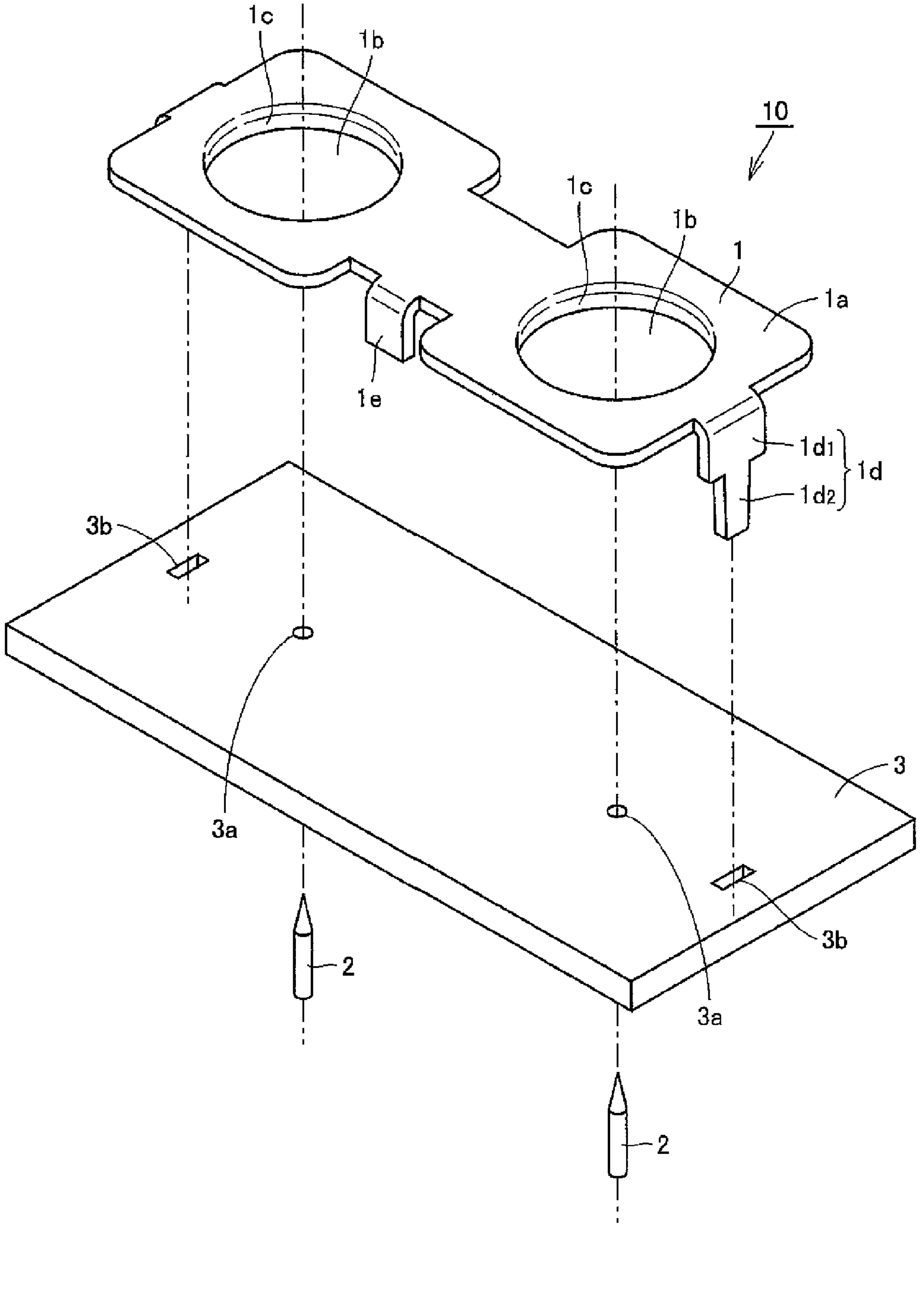
FIG. 6 is an exploded perspective view that schematically shows a configuration of an ion-generating element used in the ion-generating device shown in FIGS. 1-4.
Figure 7:
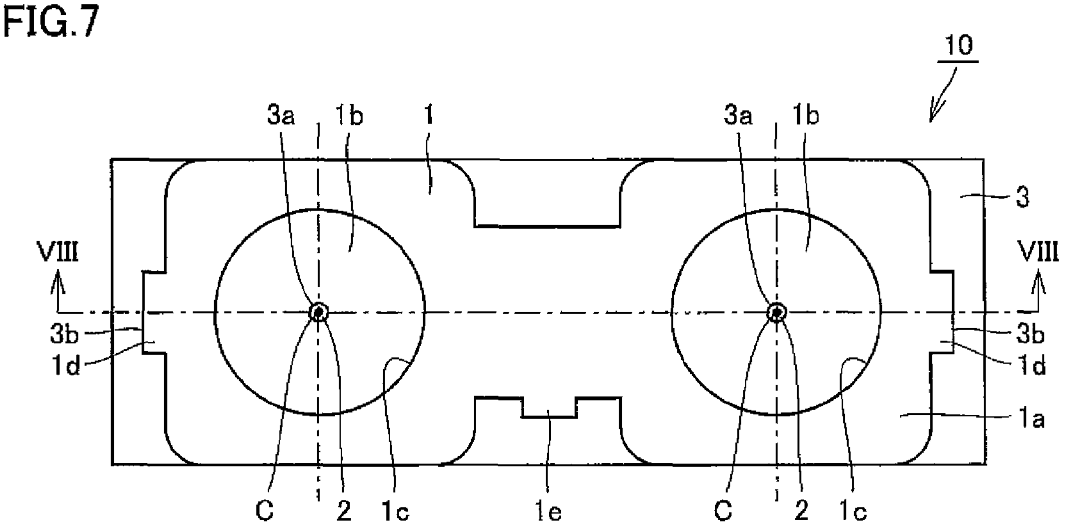
FIG. 7 is a plan view that schematically shows the configuration of the ion-generating element used in the ion-generating device shown in FIGS. 1-4.
Figure 8:
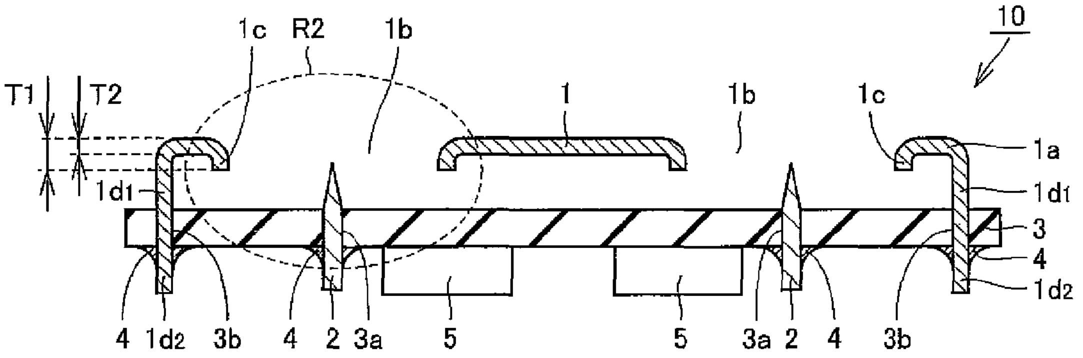
FIG. 8 is a schematic cross-sectional view taken along a line VIII-VIII in FIG. 7.
Figure 9:
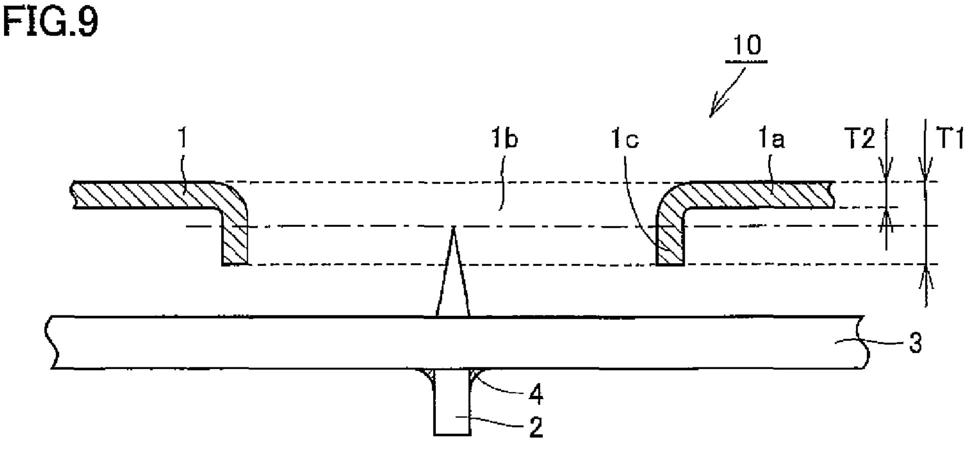
FIG. 9 is an enlarged cross-sectional view that shows an R2 portion in FIG. 8 in an enlarged manner.

FIG. 6 and FIG. 7 are an exploded perspective view and a plan view, respectively, that schematically show a configuration of an ion-generating element used in the ion-generating device shown in FIGS. 1-4. FIG. 8 is a schematic cross-sectional view taken along a line VIII-VIII in FIG. 7. FIG. 9 is an enlarged cross-sectional view that shows an R2 portion in FIG. 8 in an enlarged manner.

With reference to FIGS. 6-8, ion-generating element 10 is for generating at least any of positive ions and negative ions by corona discharge, for example, and has an induction electrode 1, a discharge electrode 2, and a supporting substrate 3.

Induction electrode 1 is made of a one-piece metal plate, and has a plurality of through holes 1*b* provided at a top plate portion 1*a*, the number of through holes 1*b* corresponding to the number of discharge electrodes 2. Through hole 1*b* serves as an opening for ejecting ions generated by corona discharge to the outside of ion-generating element 10.

In the present embodiment, the number of through holes 1*b* is two, for example, and through hole 1*b* has, for example, a circular planar shape. A rim portion of through hole 1*b* is identified as a bent portion 1*c*, which is made by bending the metal plate with respect to top plate portion 1*a* by a processing method such as drawing. As shown in FIGS. 8 and 9, bent portion 1*c* allows a thickness T1 of a wall portion of a rim of through hole 1*b* to be larger than a plate thickness T2 of top plate portion 1*a*.

Induction electrode 1 further has a substrate-inserted portion 1*d* at each of opposite end portions, for example, which substrate-inserted portion 1*d* is made by bending a part of the metal plate with respect to top plate portion 1*a*. Substrate-inserted portion 1*d* has a large-width supporting portion $1d_1$ and a small-width inserted portion $1d_2$. Supporting portion $1d_1$ has one end linked to top plate portion 1*a*, and the other end linked to inserted portion $1d_2$.

Induction electrode 1 may also have a substrate-supporting portion 1*e*, which is made by bending a part of the metal plate with respect to top plate portion 1*a*. Substrate-supporting portion 1*e* is bent in a direction identical to the bending direction of substrate-inserted portion 1*d* (downward in FIG. 6). A length of substrate-supporting portion 1*e* in the bending direction is approximately the same as a length of supporting portion $1d_1$ of substrate-inserted portion 1*d* in the bending direction.

It is noted that bent portion 1*c* may be bent in a direction identical to the direction along which substrate-inserted portion 1*d* and substrate-supporting portion 1*e* extend (downward in FIG. 6), or may also be bent in a direction opposite to the direction along which substrate-inserted portion 1*d* and substrate-supporting portion 1*e* extend (upward in FIG. 6). Further, bent portion 1*c*, substrate-inserted portion 1*d*, and substrate-supporting portion 1*e* are bent at, for example, approximately a right angle with respect to top plate portion a.

Discharge electrode 2 has a needle-like tip. Supporting substrate 3 has a through hole 3*a* for allowing discharge electrode 2 to be inserted therethrough, and a through hole 3*b* for allowing inserted portion $1d_2$ of substrate-inserted portion 1*d* to be inserted therethrough.

Needle-like discharge electrode 2 is supported by supporting substrate 3 while being inserted or press-fitted into through hole 3*a* and penetrating supporting substrate 3. Consequently, one end of discharge electrode 2, which is a needle-like end, protrudes through a front surface side of supporting substrate 3. To the other end of discharge electrode 2, which protrudes through a back surface side of supporting substrate 3, it is possible to electrically connect a lead wire or a wiring pattern with the use of solder 4, as shown in FIGS. 8 and 9.

Inserted portion $1d_2$ of induction electrode 1 is supported by supporting substrate 3 while being inserted into through hole 3*b* and penetrating supporting substrate 3. To a tip of inserted portion $1d_2$, which protrudes through the back surface side of supporting substrate 3, it is possible to electrically connect a lead wire or a wiring pattern by using solder 4, as shown in FIG. 8.

While induction electrode 1 is being supported by supporting substrate 3, a step portion located between supporting portion $1d_1$ and inserted portion $1d_2$ abuts against the front surface of supporting substrate 3. Consequently, top plate portion 1*a* of induction electrode 1 is supported with respect to supporting substrate 3 with a prescribed distance maintained. Further, a tip of substrate-supporting portion 1*e* of induction electrode 1 abuts against the front surface of supporting substrate 3 in an assisting manner. Stated differently, substrate-inserted portion 1*d* and substrate-supporting portion 1*e* enable induction electrode 1 to be positioned with respect to supporting substrate 3 in its thickness direction.

Further, while induction electrode 1 is being supported by supporting substrate 3, discharge electrode 2 is disposed such that its needle-like tip is located at the center C of circular through hole 1*b* as shown in FIG. 7, and located within a range of a thickness T1 (i.e. a bent length of bent portion 1*c*) of the rim portion of through hole 1*b* as shown in FIG. 9. To the back surface (surface for soldering) of supporting substrate 3, a constituent element of high-voltage circuit 5 is attached as shown in FIG. 8.

As a dimensional example, thickness T1 (i.e. a bent length of bent portion 1*c*) of the rim portion of through hole 1*b* is approximately at least 1 mm and at most 2 mm, and plate thickness T2 of plate-like induction electrode 1 is approximately at least 0.5 mm and at most 1 mm. A thickness measured from a top surface of supporting substrate 3 to the surface of induction electrode 1 is approximately at least 2 mm and at most 4 mm. It is thereby possible to reduce the thickness of ion-generating device 50 that accommodates ion-generating element 10 therein, to approximately at least 5 mm and at most 8 mm.

Figure 10:
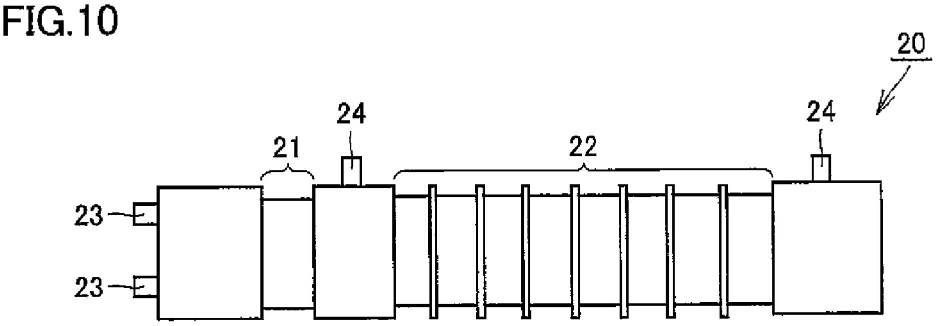
FIG. 10 is a plan view that schematically shows a configuration of a high-voltage transformer used in the ion-generating device shown in FIGS. 1-4.

FIG. 10 is a plan view that schematically shows a configuration of a high-voltage transformer used in the ion-generating device shown in FIGS. 1-4. With reference to FIG. 10, high-voltage transformer 20 is made of, for example, a winding transformer. Winding transformer 20 is configured such that a primary winding 21 and a secondary winding 22, which are insulated from each other, are wound around a bobbin surrounding an iron core. Primary winding 21 and secondary winding 22 are disposed side by side.

Generally, a voltage generated on a secondary side of winding transformer 20 is determined by a turn ratio between primary winding 21 and secondary winding 22, and an inductance. To generate a high voltage, secondary winding 22 generally requires a few thousand turns. When a winding is wound around a narrow region of the bobbin by a few thousand turns, a thickness of winding transformer 20 is increased. Therefore it is preferable to adopt a bobbin structure in which a single winding is not wound around a bobbin at a time by a few thousand turns, but wound in a divided manner to form as many layers as possible such that each layer has smaller number of turns, so as to achieve a reduced thickness as a whole. If the division number is excessively increased, a length of winding transformer 20 is increased, which is disadvantageous for a size reduction, so that an appropriate division number should be adopted.

It is noted that both terminals 23, 23 of primary winding 21 are disposed at an end portion of winding transformer 20 in a longitudinal direction (in a direction along which primary winding 21 and secondary winding 22 are adjacent to each other), and both terminals 24, 24 of secondary winding 22 are disposed at a side portion of winding transformer 20.

Figure 11:
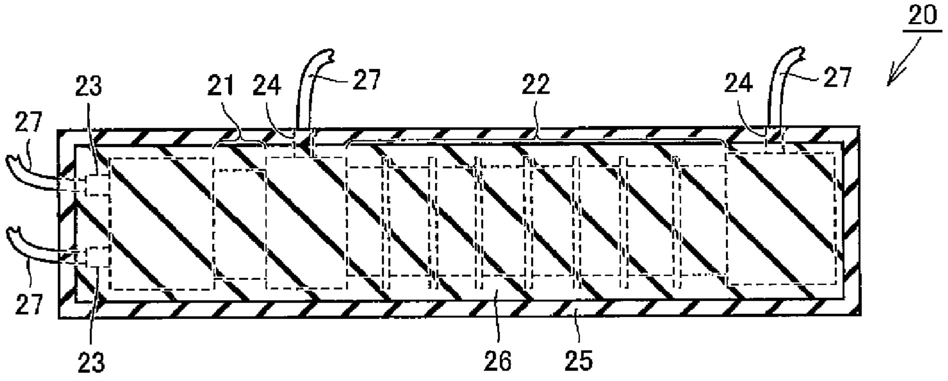
FIG. 11 is a plan view that shows how the high-voltage transformer is molded within a casing.

High-voltage transformer 20 may be disposed alone in high-voltage transformer block 40B of main body 40*a* as shown in FIG. 10. Alternatively, high-voltage transformer 20, which is accommodated in a casing 25 as shown in FIG. 11, may also be disposed in high-voltage transformer block 40B. In this state, molding is performed while high-voltage transformer 20 is being accommodated in casing 25, and a gap between casing 25 and high-voltage transformer 20 is filled with a molding material 26. Thereby insulation performance is ensured in high-voltage transformer 20 alone. A lead wire 27 is connected to each of terminals 23, 24 of high-voltage transformer 20 and led out to the outside of casing 25.

With reference to FIG. 3, high-voltage transformer drive circuit 30 has a function of receiving power supply from power supply input connector 30*b*, storing the same in a capacitor, allowing the electric charges stored in the capacitor to be discharged with the use of a semiconductor switch, for example, if a voltage equal to or higher than a defined voltage is reached, and supplying a current to the primary side of high-voltage transformer 20. An element 30*a* that configures high-voltage transformer drive circuit 30 is attached to the back surface of substrate 31. Further, a part or all of power supply input connector 30*b* is attached to the back surface of substrate 31. In a state where substrate 31 mounted with high-voltage transformer drive circuit 30 and power supply input connector 30*b* is disposed in high-voltage transformer drive circuit block 40C, power supply input connector 30*b* is configured such that it can electrically connect to the outside of outer casing 40.

In this embodiment, as to substrate 31 in high-voltage transformer drive circuit block 40C, its surface for soldering is located on the upper side of FIG. 3, and its surface for components (part-attaching surface) is located on the lower side of FIG. 3. Power supply input connector 30*b* is exposed on the lower side of FIG. 3.

With reference to FIGS. 3 and 4, lid body 40*b* of outer casing 40 has an ion-ejecting hole 44 at a wall portion that faces through hole 1*b* of ion-generating element 10. Consequently, ions generated at ion-generating element 10 are ejected through hole 44 to the outside of ion-generating device 50. As described above, one of discharge electrodes 2 of ion-generating element 10 is for generating positive ions, while the other of discharge electrodes 2 is for generating negative ions. Therefore, one of holes 44 provided at outer casing 40 serves as a positive ion-generating portion, while the other of holes 44 serves as a negative ion-generating portion.

Ion-ejecting hole 44 is set to have a diameter smaller than a hole diameter of through hole 1*b* of induction electrode 1 so as to prevent direct hand contact with induction electrode 1 serving as an energized portion to prevent an electric shock. Further, the tip of discharge electrode 2 is structured such that it is positioned behind the surface of outer casing 40 by (a thickness of lid body 40*b* of outer casing 40)+(a thickness of top plate portion 1*a* of induction electrode 1)+(a bent length of induction electrode 1) in total, namely, by approximately 1.5 mm to 3.0 mm. As such, a diameter of ion-ejecting hole 44 must be set small so as to prevent hand contact with induction electrode 1 and the tip of discharge electrode 2. However, an excessively small diameter causes decrease in amount of ejected ions, so that the diameter is set to have a dimension of; for example, 6 mm.

As described above, ion-generating device 50 has a thickness of at least 5 mm and at most 8 mm. However, it may of course have a thickness equal to or larger than the above-described thickness.

Next, there will be described how the functional elements are electrically connected.

Figure 12:
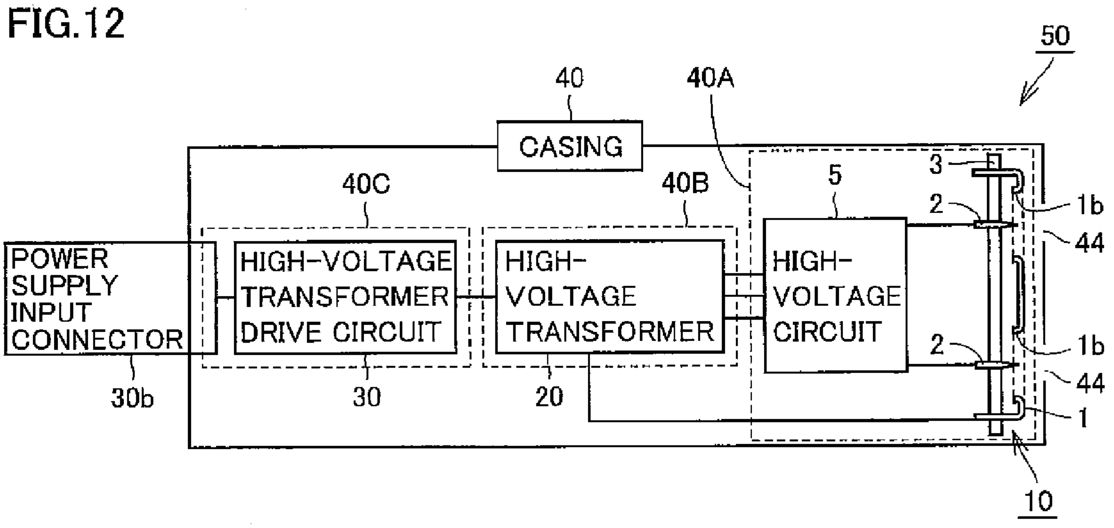
FIG. 12 is a functional block diagram of the ion-generating device in one embodiment of the present invention, showing electrical connection between functional elements.

FIG. 12 is a functional block diagram of the ion-generating device in one embodiment of the present invention, showing electrical connection between the functional elements. With reference to FIG. 12, ion-generating device 50 has, as described above, outer casing 40, ion-generating element 10 and high-voltage circuit 5 disposed in ion-generating element block 40A, high-voltage transformer 20 disposed in high-voltage transformer block 40B, high-voltage transformer drive circuit 30 disposed in high-voltage transformer drive circuit block 40C, and power supply input connector 30*b*. It is noted that power supply input connector 30*b* has a part disposed in high-voltage transformer drive circuit block 40C and another part exposed to the outside of outer casing 40, and hence is structured such that power supply can be connected thereto from the outside via a connector.

Power supply input connector 30*b* is identified as a portion that receives supply of direct-current power supply and commercial alternating-current power supply, as input power supply. Power supply input connector 30*b* is electrically connected to high-voltage transformer drive circuit 30. High-voltage transformer drive circuit 30 is electrically connected to the primary side of high-voltage transformer 20. High-voltage transformer 20 is for boosting a voltage input to the primary side and outputting the boosted voltage to the secondary side. The secondary side of high-voltage transformer 20 has one end electrically connected to induction electrode 1 of ion-generating element 10, and the other end electrically connected to discharge electrode 2 via high-voltage circuit 5.

High-voltage circuit 5 is configured to apply a positive high voltage, with respect to induction electrode 1, to discharge electrode 2 to generate positive ions, and to apply a negative high voltage, with respect to induction electrode 1, to discharge electrode 2 to generate negative ions. It is thereby possible to generate dual-polarity ions, namely, positive ions and negative ions. Of course, depending upon a configuration of high-voltage circuit 5, it is also possible to exclusively generate positive ions or negative ions.

As shown in FIG. 2, for example, regarding a specific configuration for connection, high-voltage transformer 20 has terminal 23 of the primary side and terminal 24 of the secondary side. Terminal 23 is directly connected to the front surface (surface for soldering) of substrate 31 mounted with high-voltage transformer drive circuit 30, by solder connection. Terminal 24 is directly connected to the back surface (surface for soldering) of supporting substrate 3 mounted with high-voltage circuit 5, by solder connection. Alternatively, instead of using terminals 23, 24, a lead wire may be used to obtain the above-described connection.

Power supply input connector 30*b* and high-voltage transformer drive circuit 30 are electrically connected by a lead wire or a wiring pattern, not shown, while being mounted on substrate 31 as shown in FIG. 3. Ion-generating element 10 and high-voltage circuit 5 are electrically connected to high-voltage transformer 20 by a lead wire or a wiring pattern, not shown, while being mounted on supporting substrate 3.

Next, molding will be described.

As described above, molding is performed as appropriate in the state where the functional elements are accommodated in the outer casing and electrically connected. Here, ion-generating element block 40A and high-voltage transformer block 40B are high-voltage portions, and hence it is desirable that the insulation of ion-generating element block 40A except for the ion-generating portion (the front surface side of supporting substrate 3), namely, the back surface side (the side of a surface for soldering) of supporting substrate 3, and high-voltage transformer block 40B is reinforced by a molding resin (e.g. an epoxy resin). If high-voltage transformer 20 is accommodated in casing 25 as shown in FIG. 11) it is preferable that high-voltage transformer 20 is independently molded by subjecting an inside of casing 25 to molding. If high-voltage transformer 20 is accommodated alone in high-voltage transformer block 40B as shown in FIG. 1, it is preferable that high-voltage transformer 20 and the back surface side of supporting substrate 3 in ion-generating element block 40A are molded together.

Figure 5:
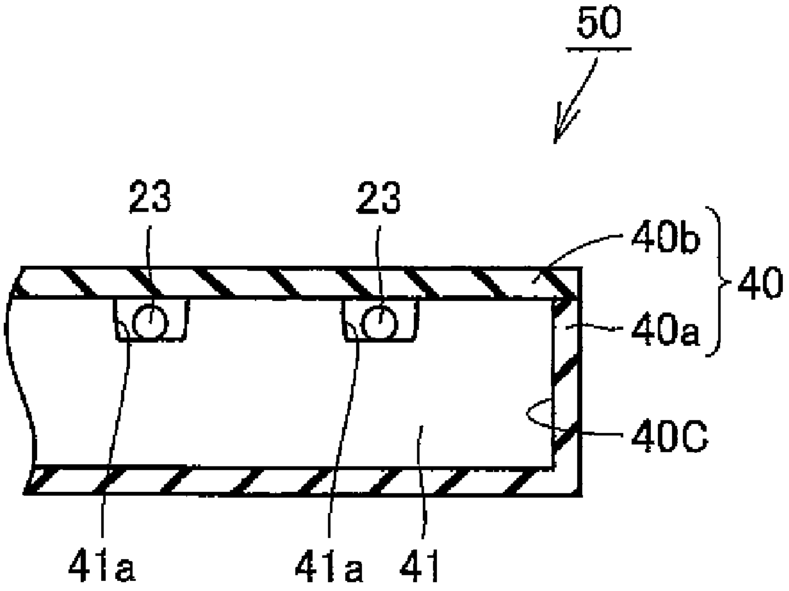
FIG. 5 is a view of an R1 portion in FIG. 2, seen in a direction of an arrow A.

In the latter case, outer casing 40 is provided with a wall 41 so as to prevent a molding compound from flowing from high-voltage transformer block 40B into high-voltage transformer drive circuit block 40C. However, it is also necessary to allow a connecting portion (such as a lead wire) for connecting input terminal 23 of high-voltage transformer 20 to high-voltage transformer drive circuit 30 to pass through wall 41. Therefore, as shown in FIG. 5, it is preferable that a notch portion 41*a* for allowing the connecting portion to pass therethrough is provided at a part of wall 41.

High-voltage transformer drive circuit block 40C may also be subjected to molding depending upon an environment in which ion-generating device 50 is used. Basically, block 40C is exposed to a relatively low voltage when compared with other blocks because a voltage applied to block 40C is a power supply voltage for household purposes. Block 40C is covered with outer casing 40, and hence may not require molding as long as it is not placed in a special environment such as at high humidity or in heavy dust. Therefore block 40C can be made to have a molding-selectable structure (moldable configuration).

Here, the molding-selectable structure (moldable configuration) means that this structure is configured such that, while substrate 31 mounted with high-voltage transformer drive circuit 30 and power supply input connector 30*b* is being disposed in high-voltage transformer drive circuit block 40C, a molding material is allowed to flow from the front surface side (lid side) of substrate 31 to reach the back surface side (bottom portion side of main body 40*a*), and that the molding material is prevented from leaking from the bottom portion of main body 40*a* of outer casing 40.

In other words, molding is performed after the functional elements are disposed in outer casing 40, and hence outer casing 40 and substrate 31 must be configured such that, even if a molding material is poured from the front surface side of substrate 31, the molding material can reach the back surface side identified as a component-mounted surface. Further, the molding material is in a liquid state when being poured, and hence if the bottom portion of outer casing 40 is not hermetically sealed, the molding material leaks to the outside of outer casing 40. Accordingly, to prevent the leakage of a molding material, it is necessary to cause the bottom portion of outer casing 40 to have a hermetically-sealed structure.

Figure 13:
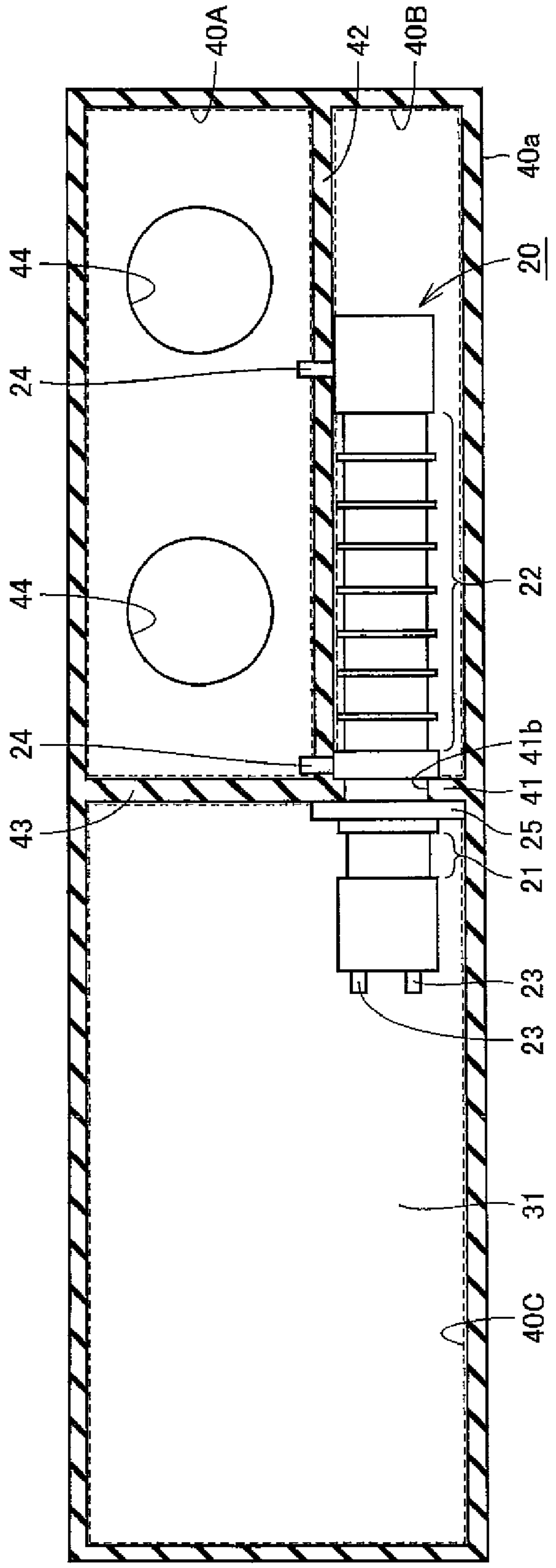
FIG. 13 is a plan view that shows a configuration in which only a secondary side of the high-voltage transformer is disposed in a high-voltage transformer block, while a primary side of the high-voltage transformer is disposed in a high-voltage transformer drive circuit block.

In the foregoing, there has been described the configuration in which the entire high-voltage transformer 20 is disposed in high-voltage transformer block 40B as shown in FIG. 2. However, as shown in FIG. 13, at least the secondary side (secondary winding 22 and terminal 24) of high-voltage transformer 20 is required to be disposed in high-voltage transformer block 40B, and the primary side (primary winding 21 and terminal 23) of high-voltage transformer 20 may be disposed in high-voltage transformer drive circuit block 40C. In this case, it is necessary to provide a notch portion 41*b* for allowing high-voltage transformer 20 to be fitted thereinto, at wall 41 that serves as a partition between high-voltage transformer block 40B and high-voltage transformer drive circuit block 40C.

Figure 14:
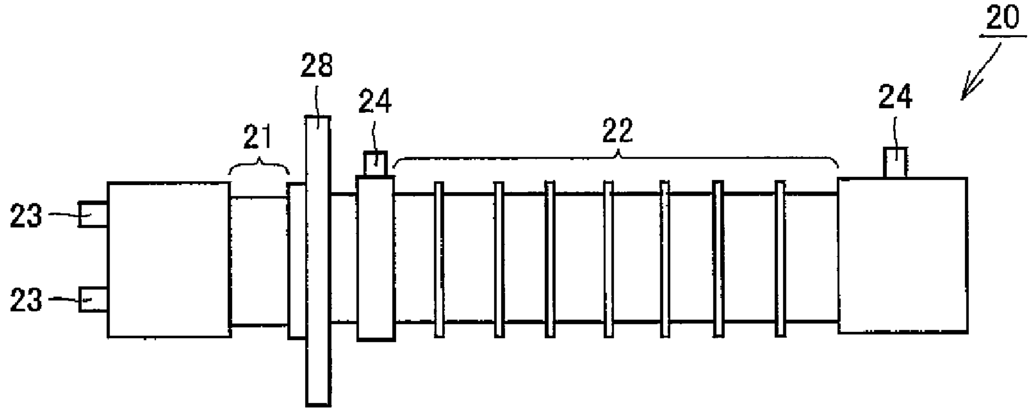
FIG. 14 is a plan view that shows a configuration in which a diameter-enlarged portion is provided between the primary side and the secondary side of the high-voltage transformer.

Further, if the inside of high-voltage transformer drive circuit block 40C is not subjected to molding in this configuration, high-voltage transformer 20 preferably has a diameter-enlarged portion 28, which has a diameter larger than a diameter of another portion of high-voltage transformer 20, at an intermediate site between the primary side (primary winding 21 and terminal 23) and the secondary side (secondary winding 22 and terminal 24) as shown in FIG. 14. Consequently, while high-voltage transformer 20 is being fitted into notch portion 41*b* at wall 41 as shown in FIG. 13, one end face of diameter-enlarged portion 28 of high-voltage transformer 20 abuts against wall 41. It is thereby possible to prevent a molding compound in high-voltage transformer block 40B from flowing into high-voltage transformer drive circuit block 40C.

In the foregoing, there has been described the case where ion-ejecting hole 44 is provided at lid body 40*b* of outer casing 40. However, as shown in FIG. 13, hole 44 may be provided at the bottom surface of main body 40*a* of outer casing 40. Stated differently, lid body 40*b* may be a side where ion-ejecting hole 44 is provided, or may be a side where ion-ejecting hole 44 is not provided.

Figure 15:
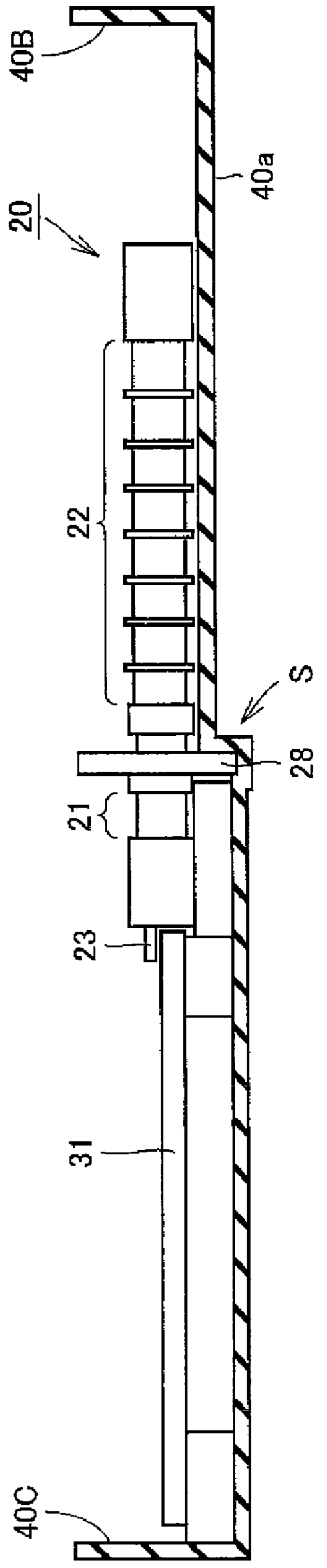
FIG. 15 is a drawing that shows a configuration in which a step is provided at a casing bottom portion between the high-voltage transformer block and the high-voltage transformer drive circuit block.

Further, as shown in FIG. 15, by providing a step S at the bottom portion of outer casing 40 between high-voltage transformer block 4013 and high-voltage transformer drive circuit block 40C, a position of terminal 23 of high-voltage transformer 20 in the height direction may also be set at a position that allows terminal 23 to be in contact with the top surface of substrate 31 mounted with high-voltage transformer drive circuit 30, while high-voltage transformer 20 is being disposed in outer casing 40. It is thereby possible to directly connect terminal 23 of high-voltage transformer 20 to substrate 31 by soldering or the like.

It is noted that, in FIG. 15, an illustration of the wall that serves as a partition between high-voltage transformer block 40B and high-voltage transformer drive circuit block 40C is omitted for convenience of description.

Figure 16:
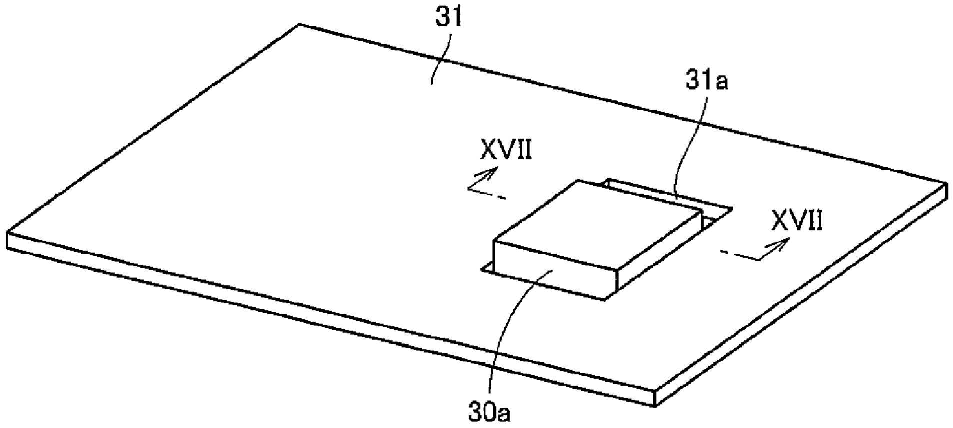
FIG. 16 is a perspective view that shows how an element of the drive circuit is disposed in a through hole made by hollowing out a substrate on which the high-voltage transformer drive circuit is mounted.
Figure 17:
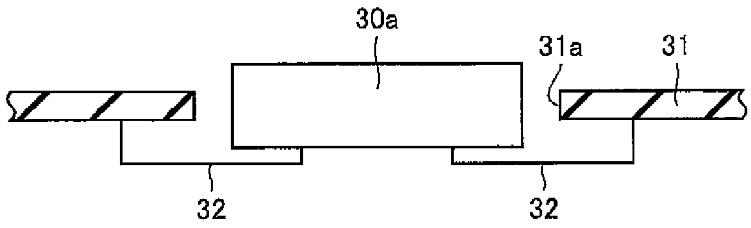
FIG. 17 is a partial cross-sectional view taken along a line XVII-XVII in FIG. 16.

Further, as shown in FIG. 16, if element 30*a* that configures the high-voltage transformer drive circuit is mounted on substrate 31, element 30*a* may be disposed in a through hole 31*a* made by hollowing out a part of substrate 31. In this case, element 30*a* is electrically connected to other elements via a lead wire 32 or the like as shown in FIG. 17. Although lead wire 32 is disposed on the lower side of substrate 31 in FIG. 17, it may also be disposed on the upper side of substrate 31. By disposing element 30*a* in through hole 31*a* of substrate 31 as such, it is possible to achieve further reduction in thickness when compared with the case where element 30*a* is mounted on substrate 31.

If ions of any one of polarities, namely, positive ions or negative ions are to be generated in the above-described ion-generating device, a position of the needle-like tip of discharge electrode 2 that generates ions, is aligned with the center of through hole 1*b* of induction electrode 1, and is disposed within a range of thickness T1 of through hole 1*b* of induction electrode 1, so that induction electrode 1 and the needle-like tip of discharge electrode 2 face each other with an air space interposed therebetween.

To eject dual-polarity ions, namely, positive ions and negative ions, a position of the needle-like tip of discharge electrode 2 that generates positive ions and a position of the needle-like tip of discharge electrode 2 that generates negative ions are disposed at a prescribed distance ensured therebetween, are aligned with the centers of through holes 1*b* of induction electrode 1, respectively, and are disposed within a range of thickness T1 of through holes 1*b* of induction electrode 1, respectively, so that induction electrode 1 and the needle-like tip portion of discharge electrode 2 face each other with an air space interposed therebetween.

In ion-generating element 10 described above, when plate-like induction electrode 1 and needle-like discharge electrode 2 are disposed at a prescribed distance ensured therebetween as described above, and a high voltage is applied between induction electrode 1 and discharge electrode 2, corona discharge occurs at the needle-like tip of discharge electrode 2. The corona discharge causes generation of at least any of positive ions and negative ions, and these ions are ejected via through hole 1*b* provided at induction electrode 1 to the outside of ion-generating element 10. By introducing blown air, ions can more effectively be ejected.

If both of positive ions and negative ions are to be generated, positive corona discharge is made to occur at the tip of one of discharge electrodes 2 so as to generate positive ions, and negative corona discharge is made to occur at the tip of the other of discharge electrodes 2 so as to generate negative ions. A waveform to be applied is not particularly limited herein, and a direct-current, an alternating-current waveform biased positively and negatively, a pulse waveform biased positively and negatively, or the like at a high voltage is used. A voltage value is selected to fall within a voltage range that sufficiently causes discharge and generates prescribed ion species.

Here, positive ions are cluster ions each of which is identified as a hydrogen ion ($H^+$) having a plurality of water molecules attached therearound, and are represented as $H^+(H_2O)_m$ (m is an arbitrary natural number). Negative ions are cluster ions each of which is identified as an oxygen ion ($O_2^-$) having a plurality of water molecules attached therearound, and are represented as $O_2^-(H_2O)_n$ (n is an arbitrary natural number).

According to ion-generating device 50 in the present embodiment, the inside of outer casing 40 is partitioned, in a plan view, into high-voltage transformer drive circuit block 40C, high-voltage transformer block 40B, and ion-generating element block 40A as shown in FIGS. 1 and 2, so that it is possible to separately subject the blocks to molding. For example, it is possible to mold the entire secondary side of the transformer in high-voltage transformer block 40B, while it is possible to mold high-voltage circuit 5 of the ion-generating element without molding the ion-generating portion in ion-generating element block 40A. It is thereby possible to efficiently isolate the high-voltage portions of ion-generating device 50 in an insulating manner by molding, so that these portions can be disposed closely, and hence reduction in size and thickness of the ion-generating device can be achieved.

Further, as shown in FIGS. 1 and 2, high-voltage transformer 20 is accommodated in high-voltage transformer block 40B of outer casing 40, without being mounted on the front surface of substrate 31. Therefore, in high-voltage transformer block 40B, it is possible to reduce the height of outer casing 40 by a thickness of substrate 31 (e.g. 1.0 mm-1.6 mm) and a height required for connecting to substrate 31 (e.g. at least 2 mm). It is thereby possible to reduce the height of outer casing 40 in high-voltage transformer block 40B, and reduce the size of ion-generating device 50.

Further, high-voltage transformer drive circuit block 40C has a moldable configuration in a state where high-voltage transformer drive circuit 30 is disposed therein. Therefore, high-voltage transformer drive circuit block 40C can also be subjected to molding as needed, and hence further reduction in size and thickness of ion-generating device 50 can be achieved.

Further, as shown in FIGS. 1 and 2, outer casing 40 has wall 41 for serving as a partition between high-voltage transformer drive circuit block 40C and high-voltage transformer block 40B, and wall 41 has notch portion 41*a* for allowing the connecting portion (terminal 23 or a lead wire) that electrically connects high-voltage transformer drive circuit 30 and high-voltage transformer 20 to pass therethrough. Wall 41 can provide a partition between high-voltage transformer drive circuit block 40C and high-voltage transformer block 40B in a plan view, and notch portion 41*a* provided at wall 41 enables high-voltage transformer drive circuit 30 and high-voltage transformer 20 to be electrically connected to each other.

Further, in ion-generating element 10 as shown in FIGS. 6-9, induction electrode 1 is made of a one-piece metal plate, and hence its thickness can be reduced. It is thereby possible to achieve reduction in thickness. Further, the rim portion of through hole 1*b* is bent as in bent portion 1*e*, and hence although induction electrode 1 is made of a one-piece metal plate, thickness T1 of the wall portion of through hole 1*b* can be made larger than plate thickness T2 of top plate portion 1*a*. By placing the needle-like tip within the range of thickness T1 of through hole 1*b*, the shortest distance between induction electrode 1 and discharge electrode 2 corresponds to the distance between the needle-like tip of discharge electrode 2 and the rim portion of through hole 1*b* in induction electrode 1. Here, thickness T1 of the rim portion of through hole 1*b* is made larger than plate thickness T2 of the metal plate, and hence even if a position of discharge electrode 2 is somewhat displaced in the thickness direction of the rim portion, its needle-like tip remains within the range of thickness T1 of through hole 1*b*. Therefore, the shortest distance between induction electrode 1 and discharge electrode 2 is maintained to correspond to the distance between the needle-like tip of discharge electrode 2 and the rim portion of through hole 1*b* in induction electrode 1. It is thereby possible to reduce variations in amount of generated ions, which variations are caused by variations in positional relationship.

Further, supporting substrate 3 supports both of induction electrode 1 and discharge electrode 2 such that they are positioned with respect to each other, so that it is possible to suppress variations in positional relationship between induction electrode 1 and discharge electrode 2.

Further, each of discharge electrode 2 and inserted portion 1$d_2$ penetrates supporting substrate 3 and is supported by supporting substrate 3. As such, induction electrode 1 and discharge electrode 2 can be supported by supporting substrate 3, and in addition, it becomes possible to electrically connect an electric circuit and others to each of the end portion of discharge electrode 2 and inserted portion 1$d_2$ of induction electrode 1, both of which protrude through the back surface side of supporting substrate 3.

Further, induction electrode 1 can be positioned with respect to supporting substrate 3 by abutting the end portion of substrate-supporting portion 1*e* against the front surface of supporting substrate 3, so that it is possible to further suppress variations in positional relationship between induction electrode 1 and discharge electrode 2. Further, the end portion of substrate-supporting portion 1*e* is allowed to only abut against the front surface of supporting substrate 3 without penetrating supporting substrate 3, so that it becomes easy to ensure an insulating distance from discharge electrode 2.

Each of plurality of ion-ejecting holes 44 shown in FIGS. 3 and 4 has an opening dimension smaller than the opening dimension of through hole 1*b*, and hence it is possible to prevent direct hand contact with induction electrode 1 serving as an energized portion, and prevent an electric shock.

Further, by ejecting dual-polarity ions, namely, positive ions and negative ions, and generating approximately equal amounts of $H^+(H_2O)_m$ (m is an arbitrary natural number), which are positive ions in the air, and $O_2^-(H_2O)_n$ (n is an arbitrary natural number), which are negative ions in the air, both types of ions surround funguses and viruses floating in the air. With the action of hydroxyl radicals (.OH) generated at that time, which are identified as active species, it becomes possible to eliminate the floating funguses and others.

Next, a configuration of an air-cleaning unit, which is an example of the electrical apparatus that uses the above-described ion-generating device will be described.

Figure 18:
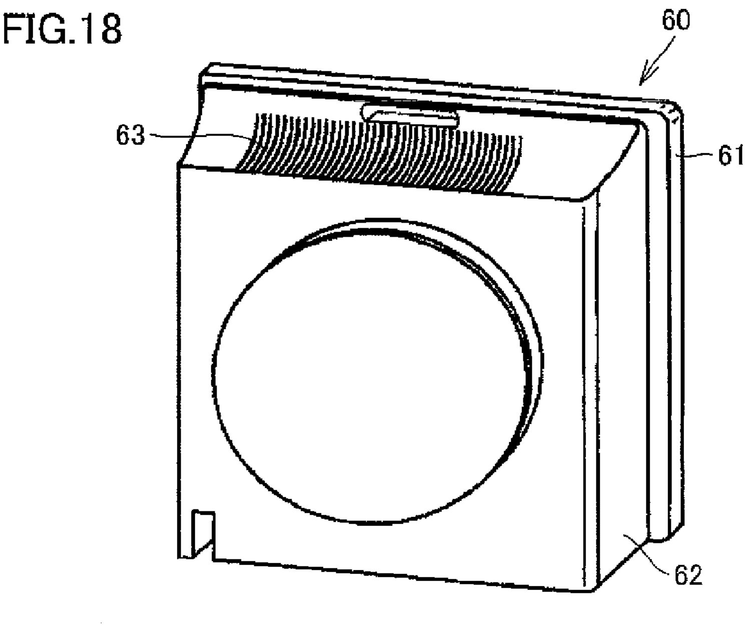
FIG. 18 is a perspective view that schematically shows a configuration of an air-cleaning unit that uses the ion-generating device shown in FIGS. 1-3.
Figure 19:
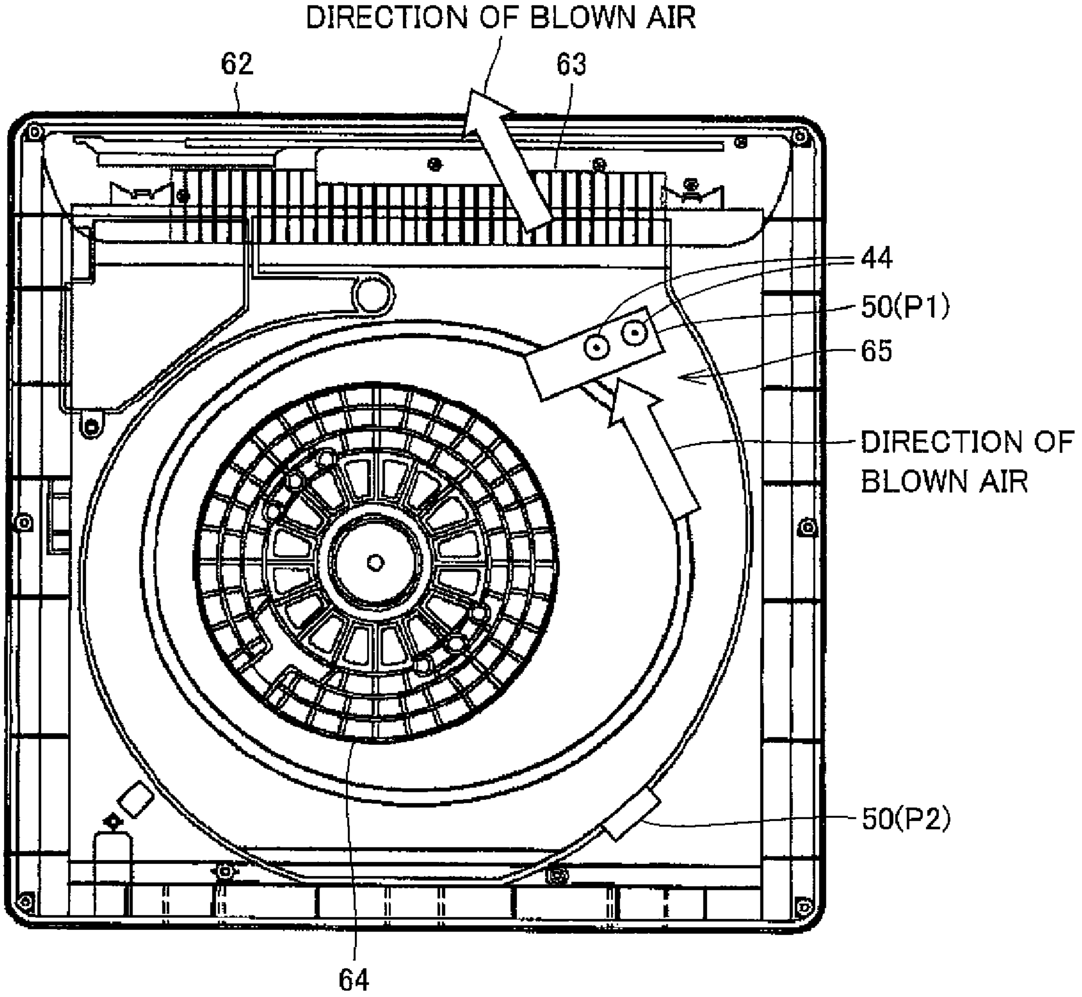
FIG. 19 is an exploded view of the air-cleaning unit, showing how the ion-generating device is disposed in the air-cleaning unit shown in FIG. 18.

FIG. 18 is a perspective view that schematically shows a configuration of an air-cleaning unit that uses the ion-generating device shown in FIGS. 1-3. FIG. 19 is an exploded view of the air-cleaning unit, showing how the ion-generating device is disposed in the air-cleaning unit shown in FIG. 18.

With reference to FIGS. 18 and 19, air-cleaning unit 60 has a front panel 61 and a main body 62. At a rear top portion of main body 62, there is provided an outlet 63, through which clean air containing ions are supplied to the room. An air intake port 64 is formed at the center of main body 62. The air taken in through air intake port 64 located at the front of air-cleaning unit 60 is cleaned by passing through a filter not shown. The cleaned air is supplied through a fan casing 65 from outlet 63 to the outside.

Ion-generating device 50 shown in FIGS. 1-3 is attached to a part of fan casing 65 that forms a passage of the cleaned air. Ion-generating device 50 is disposed such that it can eject ions through hole 44 serving as an ion-generating portion, to the above-described airflow. As examples of the arrangement of ion-generating device 50, there are considered a position P1 relatively close to outlet 63, a position P2 relatively far from outlet 63, and other positions, in the passage of the air. By allowing blown air to pass through ion-generating portion 44 of ion-generating device 50 as such, air-cleaning unit 60 can achieve an ion-generating function, namely, a function of supplying ions, along with clean air, through outlet 63 to the outside.

With air-cleaning unit 60 according to the present embodiment, ions generated at ion-generating device 50 can be delivered on the air stream owing to the air blow portion (air passage), so that ions can be ejected outside the device.

In the present embodiment, an air-cleaning unit has been described as an example of an electrical apparatus. However, the present invention is not limited thereto. The electrical apparatus may also be, in addition to the air-cleaning unit, an air-conditioning unit (air-conditioner), a cooling apparatus, a vacuum cleaner, a humidifier, a dehumidifier, an electric fan heater, and the like, as long as it is an electrical apparatus that has an air blow portion for delivering ions on the air stream.

Further in the foregoing, power supply (input power supply) to be input to ion-generating device 10 may be any of commercial alternating-current power supply and direct-current power supply. If input power supply is commercial alternating-current power supply, it is necessary to ensure a legally-defined distance between components that configure high-voltage transformer drive circuit 30 serving as the primary-side circuit, and between patterns of a printed substrate. Furthermore, a component that can have resistance to a power supply voltage is required, and hence size increase occurs. However, the circuit configuration can be simplified, and the number of components can be reduced. In contrast, if input power supply is a direct-current power supply, a requirement for the distance between the components that configure high-voltage transformer drive circuit 30 serving as the primary-side circuit, and between patterns of a printed substrate is enormously relieved when compared with the case of the commercial alternating-current power supply described above. The components can be disposed at a shorter distance, and small-sized components such as chip components can be adopted as the components, and the components can be disposed at high densities. However, a circuit for implementing the high-voltage drive circuit becomes complicated, and the number of components becomes larger when compared with the case of the alternating-current power supply described above.

High-voltage transformer 20 may be any of a winding transformer and a piezoelectric transformer. Properties of the winding transformer are generally determined by a turn ratio between the primary winding and the secondary winding, and inductance. To generate a high voltage, a few thousand turns are generally required, so that the size corresponding thereto is required. In contrast, the piezoelectric transformer requires a certain length as a principle, although some of the commercialized ones achieve reduced size and thickness. The disadvantages of the piezoelectric transformer are that it has a limited load amount in output, and that its drive circuit is complicated.

It should be understood that the embodiment disclosed herein is illustrative and not limitative in all aspects. The scope of the present invention is shown not by the description above but by the scope of the claims, and is intended to include all modifications within the equivalent meaning and scope of the claims.

INDUSTRIAL APPLICABILITY

Particularly, the present invention can advantageously be applied to an ion-generating element, an ion-generating device, and an electrical apparatus for generating at least any of positive ions and negative ions owing to corona discharge.

The invention claimed is:

1. The An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a casing having partitions forming, in a plan view, a transformer drive circuit block for disposing at least said transformer drive circuit, a transformer block for disposing at least a secondary side of said transformer, and an ion-generating element block for disposing said ion-generating element, wherein each of said transformer block and said ion-generating element block has a configuration capable of being subjected to molding.

2. An electrical apparatus, comprising:

said ion-generating device recited in claim 1; and an air blow portion for delivering at least any of positive ions and negative ions generated at said ion-generating device on an air stream of blown air.

3. An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a casing having partitions forming, in a plan view, a transformer drive circuit block for disposing at least said transformer drive circuit, a transformer block for disposing at least a secondary side of said transformer, and an ion-generating element block for disposing said ion-generating element, wherein said transformer drive circuit block is capable of being molded in a state where said transformer drive circuit is disposed therein.

4. An electrical apparatus, comprising:

said ion-generating device recited in claim 3; and an air blow portion for delivering at least any of positive ions and negative ions generated at said ion-generating device on an air stream of blown air.

5. An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a casing having partitions forming, in a plan view, a transformer drive circuit block for disposing at least said transformer drive circuit, a transformer block for disposing at least a secondary side of said transformer, and an ion-generating element block for disposing said ion-generating element, wherein said casing has a wall for serving as the partition between said transformer drive circuit block and said transformer block, and said wall has a notch portion for allowing a connecting portion which electrically connects said transformer drive circuit and said transformer to pass therethrough.

6. An electrical apparatus, comprising:

said ion-generating device recited in claim 5; and an air blow portion for delivering at least any of positive ions and negative ions generated at said ion-generating device on an air stream of blown air.

7. An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a casing having partitions forming, in a plan view, a transformer drive circuit block for disposing at least said transformer drive circuit, a transformer block for disposing at least a secondary side of said transformer, and an ion-generating element block for disposing said ion-generating element, wherein said casing has a wall for serving as the partition between a primary side and the secondary side of said transformer, said transformer has a diameter-enlarged portion having a diameter larger than a diameter of another portion of said transformer, at an intermediate site between the primary side and the secondary side, and said diameter-enlarged portion abuts against said wall in a state where said intermediate site of said transformer is fitted into a notch portion of said wall.

8. An electrical apparatus, comprising:

said ion-generating device recited in claim 7; and an air blow portion for delivering at least any of positive ions and negative ions generated at said ion-generating device on an air stream of blown air.

9. An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a casing having partitions forming, in a plan view, a transformer drive circuit block for disposing at least said transformer drive circuit, a transformer block for disposing at least a secondary side of said transformer, and an ion-generating element block for disposing said ion-generating element, wherein said ion-generating element includes an induction electrode made of a one-piece metal plate having a plurality of through holes, a thickness of a wall portion of each of said plurality of through holes being made larger than a plate thickness of said metal plate by bending a rim portion of each of said plurality of through holes, a plurality of discharge electrodes having needle-like tips which are located in said plurality of through holes of said induction electrode, respectively, and within a range of the thickness of said through holes, respectively, and a supporting substrate supporting said induction electrode and said plurality of discharge electrodes.

10. The ion-generating device according to claim 9, wherein said casing has a main body and a lid body for covering the main body, said main body having partitions forming, in a plan view, said transformer drive circuit block, said transformer block, and said ion-generating element block, and said lid body has a plurality of ion-ejecting holes provided to correspond to said plurality of through holes, respectively.

11. The ion-generating device according to claim 10, wherein each of said plurality of ion-ejecting holes has an opening dimension smaller than an opening dimension of each of said through holes.

12. The ion-generating device according to claim 9, wherein said casing has a main body and a lid body for covering the main body, said main body having partitions forming, in a plan view, said transformer drive circuit block, said transformer block, and said ion-generating element block, and a bottom portion of said main body has a plurality of ion-ejecting holes provided to correspond to said plurality of through holes, respectively.

13. An electrical apparatus, comprising:

said ion-generating device recited in claim 9; and an air blow portion for delivering at least any of positive ions and negative ions generated at said ion-generating device on an air stream of blown air.

14. An ion-generating device including a transformer drive circuit, a transformer for boosting a voltage by being driven by said transformer drive circuit, and an ion-generating element for generating at least any of positive ions and negative ions by receiving the voltage boosted by said transformer, the ion-generating device comprising:

a substrate which has said transformer drive circuit mounted on a surface; and a casing which accommodates said substrate having said transformer drive circuit mounted thereon, said transformer, and said ion-generating element, wherein said transformer is accommodated in said casing without being mounted on the surface of said substrate.

* * * * *